United States Patent

Bautista et al.

[11] Patent Number: 6,166,668
[45] Date of Patent: Dec. 26, 2000

[54] METHOD AND APPARATUS FOR PROVIDING DC OFFSET CORRECTION AND HOLD CAPABILITY

[75] Inventors: Edwin E. Bautista, Hollywood; Babak Bastani, Weston; Joseph P. Heck, Ft. Lauderdale, all of Fla.

[73] Assignee: Motorola, Inc., Schaumburg, Ill.

[21] Appl. No.: 09/323,376

[22] Filed: Jun. 1, 1999

[51] Int. Cl.$^7$ ........................................... H03M 1/06
[52] U.S. Cl. .................................................. 341/118
[58] Field of Search ...................... 341/118, 155

[56] References Cited

U.S. PATENT DOCUMENTS 4,996,529  2/1991  Connell .................................. 341/118
5,343,196  8/1994  Harston .

Primary Examiner—Brian Young
Attorney, Agent, or Firm—Frank M. Scutch, III

[57] ABSTRACT

A direct current (DC) offset correction loop (200) for determining the required amount of DC offset to an analog input signal includes a digital integrator (211) for measuring the amount of DC offset present at the final output of a forward signal path and a hold circuit (213) for controlling the digital integrator (213). The DC offset correction loop (200) provides a constant amount of DC offset correction to the analog input signal.

33 Claims, 5 Drawing Sheets

METHOD AND APPARATUS FOR PROVIDING DC OFFSET CORRECTION AND HOLD CAPABILITY

TECHNICAL FIELD

This invention relates in general to digital communications systems and more particularly to digital radio frequency (RF) receivers

BACKGROUND

In many circuit applications it is necessary to achieve alternating current (AC) coupling of RF signals. This may be necessary to keep the signal centered within the allowable voltage swing range to prevent clipping and/or to eliminate any unwanted direct current (DC) that can cause distortion. This is particularly true in zero intermediate frequency (ZIF) receiver schemes where unwanted DC signal components can cause false carrier signals.

Typically, elimination of the DC components is done by using a coupling capacitor that feeds into a resistive load. However, this technique does not achieve centering of the signal swing ahead of the capacitor. Moreover, for very low frequency coupling, the resistor and/or capacitor values must be large and not practical for IC implementation. In ZIF receiver technology that is presently used, these problems are solved by combining the use of coupling capacitors to eliminate the DC components at the baseband filter output, plus an offset correction circuit ahead of the coupling capacitors to maintain signal swing centering. Two long time constants ($\tau$) are generated with this approach namely the coupling capacitor time constant and the offset correction time constants. Each of these have a tendency to create unwanted transient responses when the baseband DC level changes due to varying signal level.

Prior art FIG. 1 shows a block diagram of a typical DC offset correction loop 100. In the implementation shown, the input 101 is a signal current while the output 109 is a signal voltage. The input signal 101 is passed through a baseband filter 103, voltage gain stage 105 and baseband filter 107. A servo loop is created by the addition of the operational transconductance amplifiers (OTA) 111 and 113 and the integrator capacitor 115.

In operation, the output voltage 109 is compared with a fixed voltage reference such as analog ground 117 in the operational transconductance amplifier 111. The difference of the output signal 109 from a reference voltage Vag is amplified into a current signal that is then integrated by the capacitor 115. The resulting voltage from the integration is applied to a second amplifier 113 to amplify the appropriate correction current Icor. Except for any input offset voltage provided by amplifier 111, the capacitor 115 provides virtually infinite gain at DC. This will remove any DC offset relative to analog ground Vag at the output 109.

The offset correction loop generally maintains the output voltage close to the analog ground reference, but as indicated above, only to within the input offset voltage of the error amplifier 111. Hence, without other techniques, it is not practical to obtain an offset voltage below the range of approximately 1 to 5 millivolts (mV) in an integrated circuit (IC) implementation.

In a ZIF IC, it has been necessary to add coupling capacitors between the output voltage 109 and the next stage in order to eliminate the offset of the error amplifier 111 to insure the DC offset is below about 0.1 mV. Additionally, other problems with this technique include the requirement that the operational transconductance amplifier 111 have a very low transconductance on the order of hundreds of pico-Siemens (pS) to tens of nano-Siemens (nS) to realize the required high pass corner of 1 Hz over the range of forward signal path gain. This realization requires relatively large silicon area and its robustness in generating the required output current is questionable.

FIG. 2 shows a graphical representation of a frequency modulated (FM) signal with a single tone that has been frequency translated to a center frequency close to 0 Hz (complex In-Phase and Quadrature-Phase signals), low pass filtered, and corrupted with a DC component at 0 Hz. The spectral components other than the one at 0 Hz represent the desirable Bessel components of the FM signal. The presence of this large DC component in the spectrum can potentially cause self-quieting of the receiver and thus requires nullification. Thus, the need exists to provide an apparatus and method for achieving AC coupling of very low signal frequencies in a relatively small IC die area without coupling capacitors. Also, the need exists to achieve centering of the signal to allow for maximum signal swing.

DETAILED DESCRIPTION OF THE PREFERRED EMBODIMENT

Figure 3:
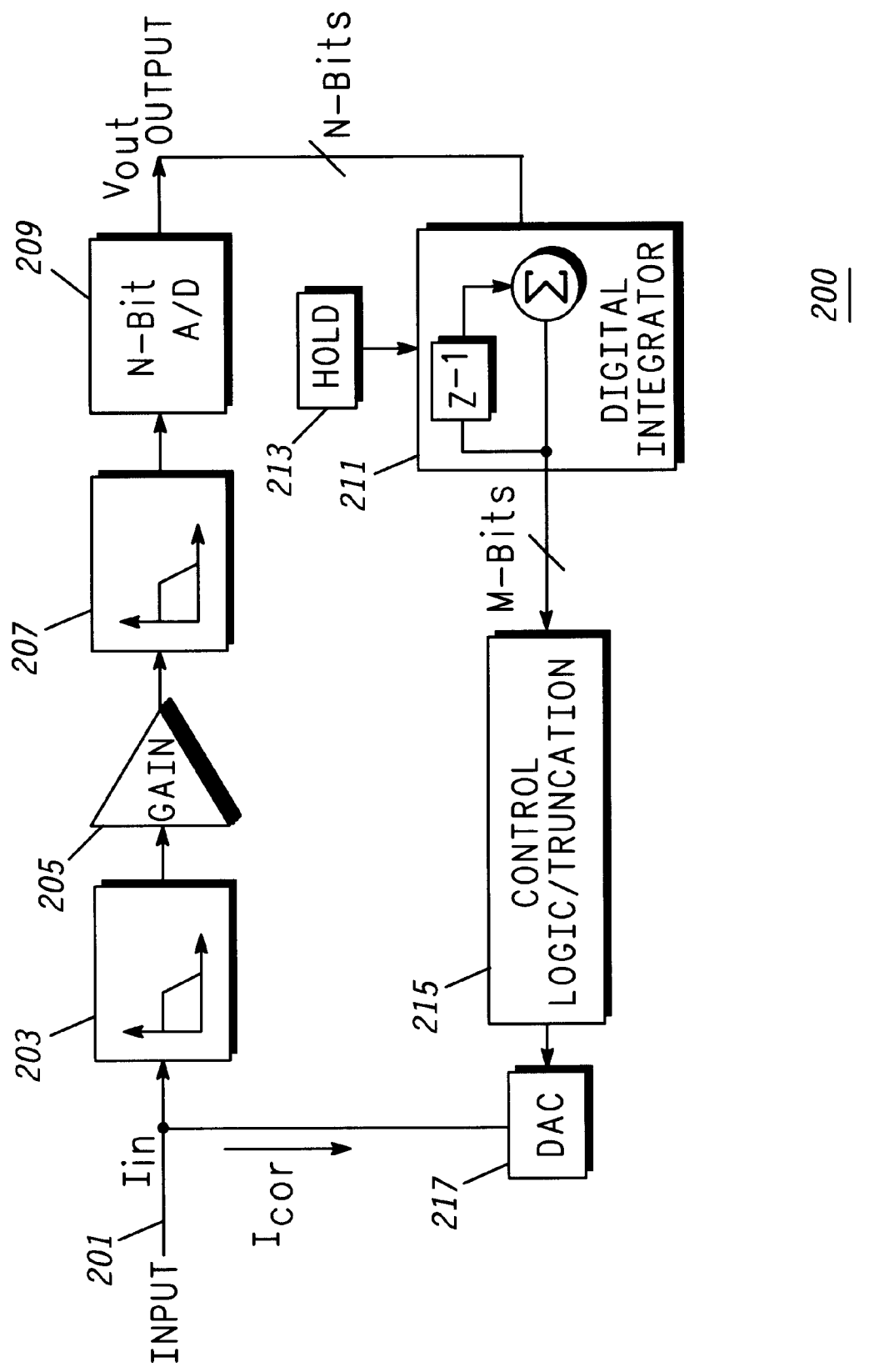
FIG. 3 is a block diagram of the current DC offset correction loop according to the preferred embodiment of the invention.

Referring now to FIG. 3, a system block diagram of the current DC offset correction loop 200 of the preferred embodiment of the invention includes an input current signal 201 that is fed into a baseband filter 203. The baseband filter 203 acts to filter and shape the input signal 201 by removing unwanted signal components tailoring the input signal to specific baseband requirements. The signal from the baseband filter 203 is then amplified using a voltage gain stage 205 where it is then input to baseband filter 207. The baseband filter 207 works to further remove undesired signal components from the amplified signal. The filtered signal from the baseband filter 207 is then fed into an analog-to-digital converter (ADC) 209 where it is digitized into the required resolution e.g. 10 bits. The resolution is selected to meet forward path requirements in order to meet dynamic range headroom parameters and/or other design constraints.

The output of the ADC 209 is then input to a digital integrator 211 that includes a hold circuit 213. As is well known in the art, a digital integrator is typically comprised of some type of digital adder and delay device $Z^{-1}$ for storing a delayed data sample. The digital integrator 211 works as an accumulator so as to add one input data bit with the one previously delayed data bit. It should also be evident to those skilled in the art that although conceptually represented here as a single bit integrator a multi-bit appellation is also possible by replicating the single bit integrator to as many data bits that are required.

The output of the integrator 211 is applied to control logic 215 that acts to truncate the output of the integrator 211 to acquire only the most significant bits in the data stream. For example, if the output of the digital integrator 211 were 32 bit words, the control logic 215 would truncate bits to provide a digital word having only the most significant 16 bits. Moreover, the control logic may also be used to partition the multi-bit word into small digital words such as two 8-bit words. One word may then be used to drive a fine DAC and the other is used to drive a coarse DAC. Both the fine and coarse DAC would be represented by DAC 217. One implementation of DAC 217 is disclosed in U.S. Pat. No. 5,343,196 which is herein incorporated by reference.

The DAC 217 acts to convert the digital word into an analog waveform where it can be used to null or adjust the DC offset of the input signal to some minimal value. The corrected signal is used in order to hold and/or maintain a certain degree of DC correction at the output of the baseband filter. The digital integrator can be placed in a "hold" mode using hold circuit 213 by first opening the feedback path at the input to the integrator and then grounding the inputs to the digital integrator thus maintaining the desired offset correction. As is well known in the art, this can be accomplished by using a plurality of switches, logic devices or otherwise. This allows for the high pass notch to be removed while at the same time controlling the DC offsets to a very low value.

Figure 4:
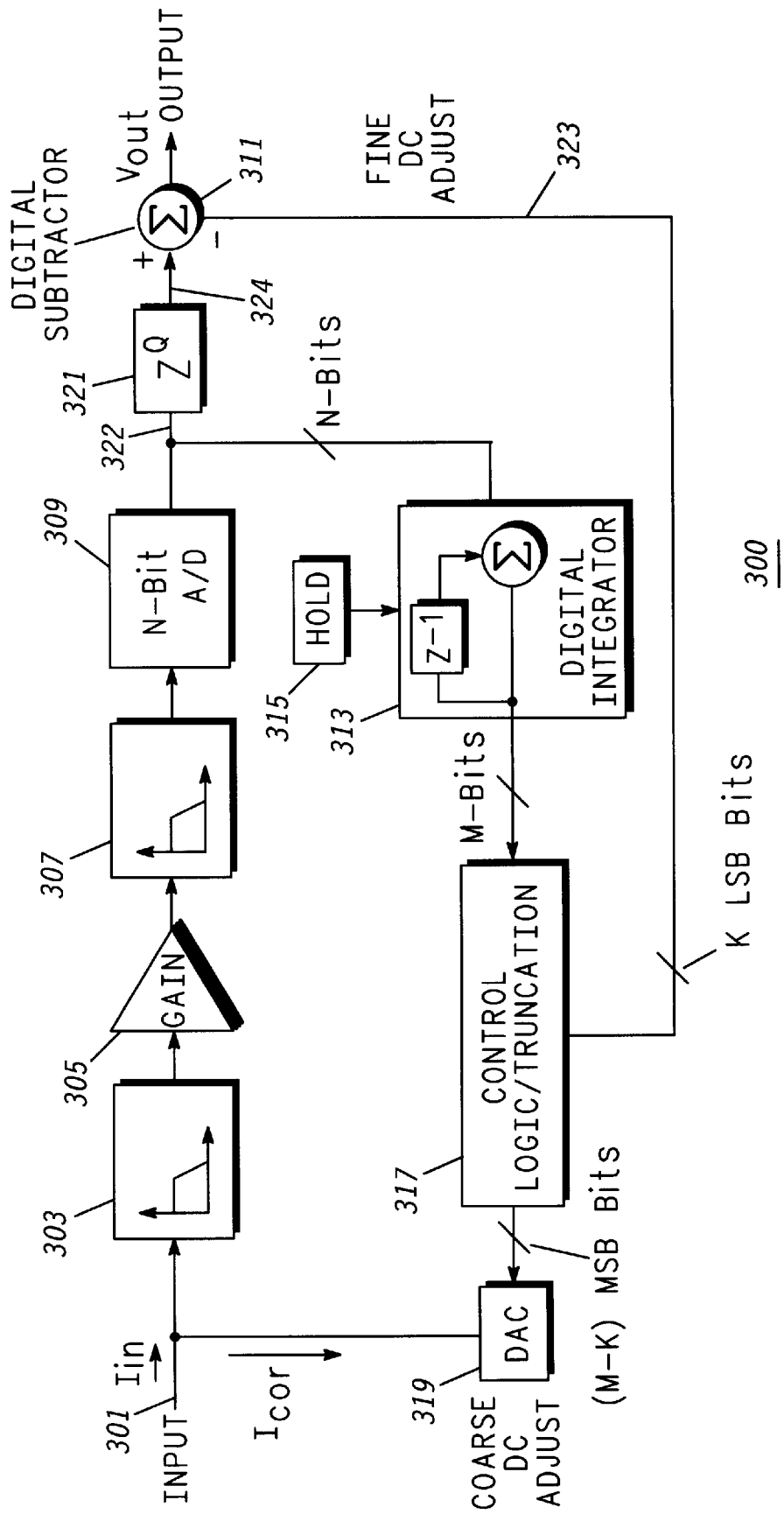
FIG. 4 is a block diagram of the current DC offset correction loop according to an alternative embodiment of the invention.

Referring now to FIG. 4, an alternative system block diagram of the current DC offset correction loop 300 includes an input current signal 301 that is fed into a baseband filter 303. The baseband filter 303 acts to filter the input signal 301 by attenuating unwanted signal components beyond a specific frequency. The signal from the baseband filter 303 is then amplified using a voltage gain stage 305 where it is then input to another baseband filter 307. The baseband filter 307 works to further remove undesired signal components from the amplified signal. The filtered signal from the baseband filter 307 is then fed into an analog-to-digital converter (ADC) 309 where it is digitized into the required resolution e.g. 10 bit words. The resolution is generally selected to meet forward path requirements in order to meet dynamic range headroom parameters and/or other design constraints.

The output of the ADC 309 is then input to digital subtractor 311 and a digital integrator 313 with hold mode capability 315. The output of the integrator 313 provides a control signal that is applied to control logic 317 that acts to truncate the output of the integrator 313 to acquire the most significant bits in the data stream that is applied to the coarse DAC 319. This technique allows for the DAC 319 design to be simplified and the DC offset is only corrected to a value that enables centering of the signal swing to avoid clipping. The remainder of the DC offset is then corrected with a feed forward loop consisting of delay block 321, digital integrator 313, control logic/truncation block 317, and digital subtractor 311. In this loop, the output 322 of ADC 309 is delayed for Q clock cycles to attain synchronization with K least significant bits (LSB) bits 323 from control logic/truncation block 317. With synchronization acquired, digital subtraction of the bit streams 324 and 323 can be performed to eliminate the remaining residual DC with the DC offset maintained using the hold mode circuit 315.

Figure 1:
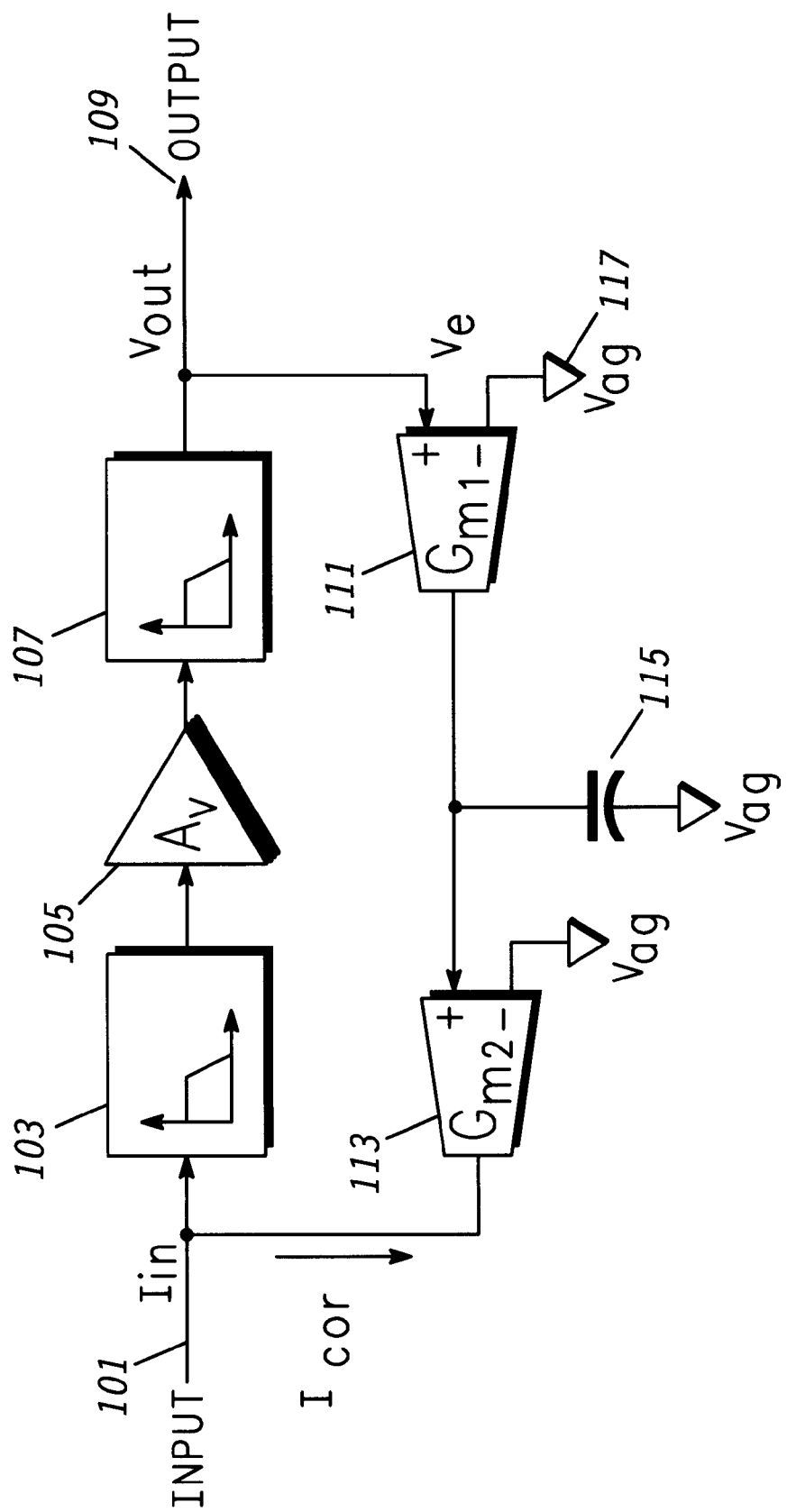
FIG. 1 is a prior art showing a typical DC offset correction loop.
Figure 2:
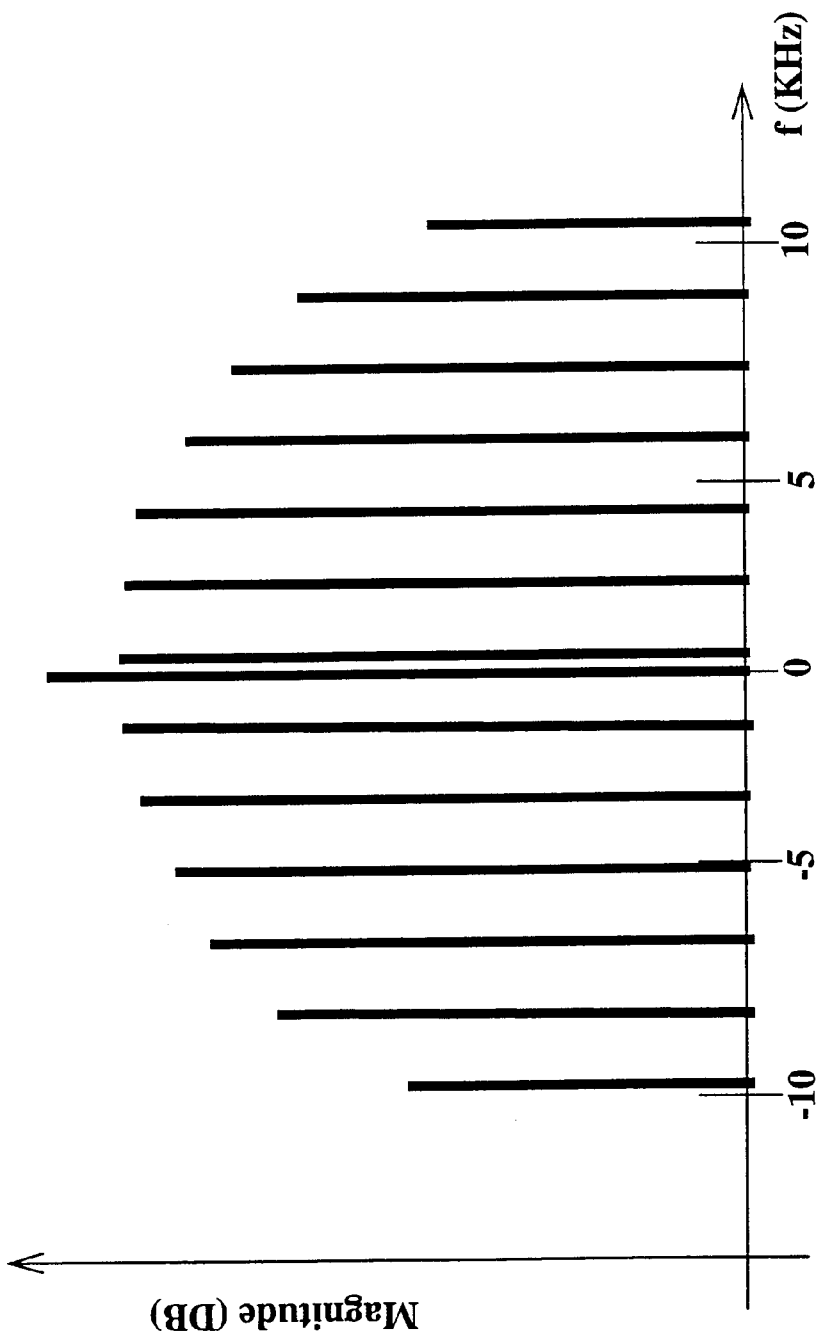
FIG. 2 is a graph showing a baseband filter output without the use of a DC correction loop.
Figure 5:
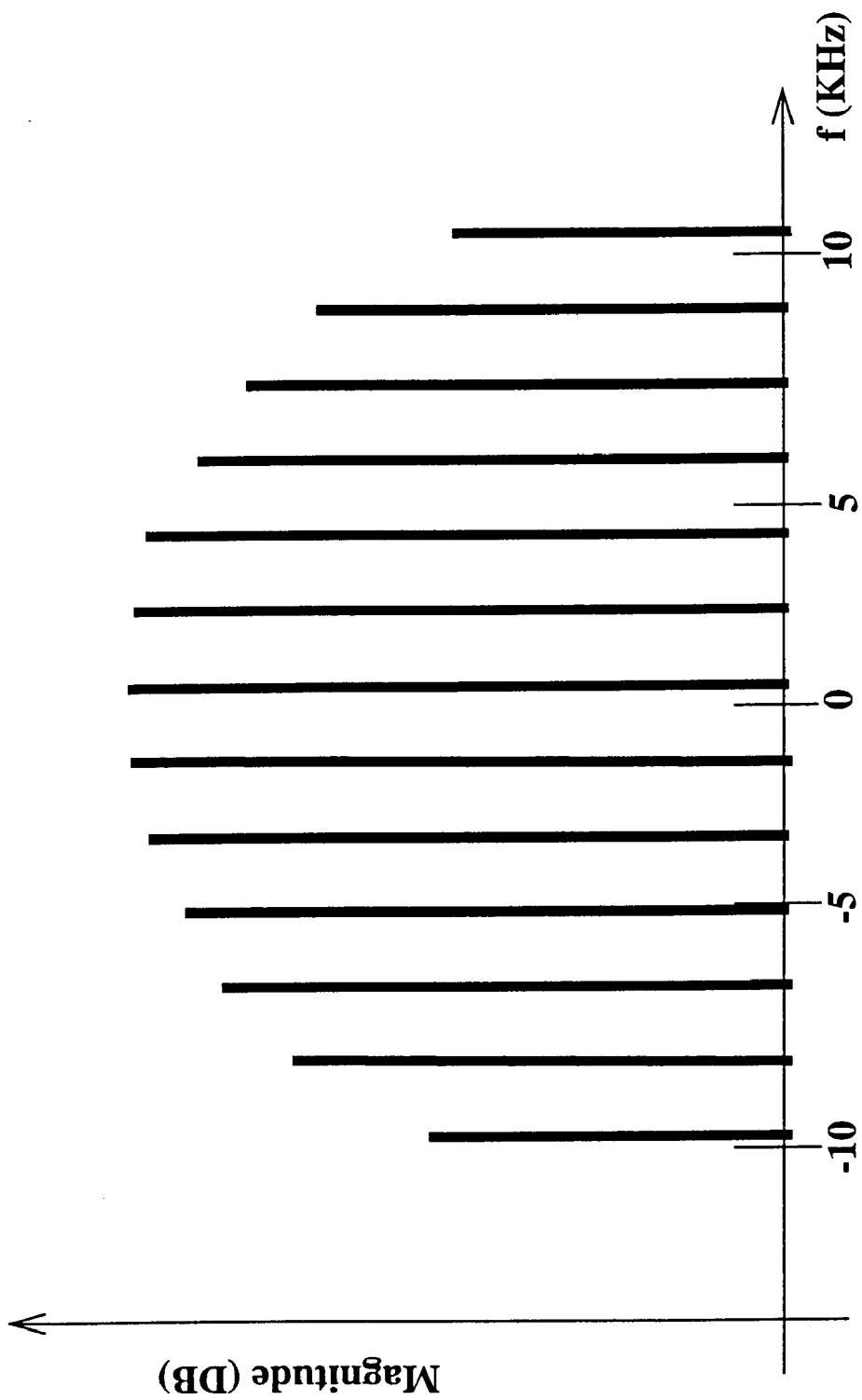
FIG. 5 is a graph showing a baseband filter output using the DC correction loop of the present invention.

FIG. 5 shows a graphical representation of the output of the DC offset correction loop shown in FIG. 3. It can be seen that the large DC component in FIG. 2 has been removed from the spectrum of the output signal while retaining the desirable Bessel components of the frequency modulated (FM) signal.

Thus, the invention provides a control loop for mitigating DC offset where a digital voltage Vout is fed into a digital integrator that eliminates the DC offset inherent in the operational transconductance amplifiers described in the prior art. The invention provides for an input analog signal current (or voltage depending upon the implementation) with an output a digital signal voltage. The use of a digital integrator in the feedback path allows the elimination of an operational transconductance amplifier/capacitor based analog integrator and all its associated drawbacks of finite output impedance, input offset voltage, and very low transconductance. Additionally, the digital integrator can be placed in a "hold" mode as previously described. This allows the high pass notch to be removed.

The invention eliminates AC coupling capacitors as well as eliminating a second high pass response associated with the capacitors which would otherwise widen the resulting zero Hz notch in the IF response. Also, the invention uses a digital integrator, which is small in area, simple to implement, offset free, and very robust. The advantage in this technique is the ability to measure the DC offset error and hold it reliably for a predetermined period of time making the implementation very suitable for time division multiple access (TDMA) applications.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A direct current (DC) offset correction loop removing unwanted DC offset from an analog input signal comprising:
   at least one baseband filter for filtering unwanted signal components from the analog input signal waveform;
   at least one digital integrator for extracting any amount of DC offset present at the final output of the forward signal path; and
   a hold circuit for controlling the digital integrator for providing a constant amount of DC offset correction to the analog input signal.

2. A DC offset correction loop as in claim 1, further comprising:
   at least one gain amplifier for amplifying the output of the at least one baseband filter.

3. A DC offset correction loop as in claim 1, further comprising:
   control logic for providing a predetermined digital signal based on information from the at least one digital integrator.

4. A DC offset correction loop as in claim 1, further comprising:
   a digital to analog converter for converting a digital DC offset correction from the at least one digital integrator to correct the DC offset of the analog input signal.

5. A DC offset correction loop as in claim 1, wherein:
   the hold circuit includes a plurality of switches for controlling the input to the at least one digital integrator.

6. HA direct current (DC) offset correction loop comprising:
   at least one analog baseband filter for filtering preselected signal components from an analog input signal having a DC offset;
   an analog to digital converter (ADC) for converting the signal from the at least one analog baseband filter to a digital signal;

a digital integrator for extracting the DC offset of the digital signal and providing a predetermined amount of DC offset correction;

control logic for converting the predetermined amount of DC offset correction into a predetermine digital format; and a digital to analog converter (DAC) for converting the predetermined digital format into a analog signal for offsetting the DC offset of the analog input signal.

7. A DC offset correction loop as in claim 6, further comprising:

a hold controller for controlling the input of the digital integrator and providing a predetermined amount of DC offset correction to the analog input signal.

8. A DC offset correction loop as in claim 7, wherein: the hold controller is comprised of at least one switch.

9. A DC offset correction loop as in claim 8 wherein the at least one switch is comprised of a plurality of logic devices.

10. A DC offset correction loop as in claim 6, further comprising;

at least one amplifier for amplifying the output of the at least one analog baseband filter.

11. A DC offset correction loop as in claim 6, wherein: the digital integrator includes at least one adder and at least one first delay circuit.

12. A DC offset correction loop as in claim 6, wherein: the ADC converts the analog signal to a multi-bit digital signal having desired resolution.

13. A DC offset correction loop as in claim 6, wherein: the at least one digital integrator produces a multi-bit signal.

14. A DC offset correction loop as in claim 6, wherein the control logic produces two digital signals from the at least one digital integrator.

15. A DC offset correction loop as in claim 6, wherein the DC offset correction is applied to the at least one analog baseband filter.

16. A DC offset correction loop as in claim 6, further comprising:

a second delay circuit for delaying the output of the analog-to-digital converter; and a digital subtractor for providing a digital control signal to the control logic based on the delayed output.

17. A DC offset correction loop as in claim 10, wherein the digital control signal provides a fine DC offset adjustment.

18. A direct current (DC) offset correction loop comprising:

at least one analog baseband filter for filtering preselected signal components from analog input signal having a DC offset;

an analog to digital converter (ADC) for converting the signal from the at least one analog baseband filter to a digital signal;

a digital integrator for extracting the DC offset of the digital signal and providing a predetermined amount of DC offset correction;

control logic for converting the predetermined amount of DC offset correction into a predetermine digital format;

a digital to analog converter (DAC) for converting the predetermined digital format into a analog signal for offsetting the DC offset of the analog input signal; and a digital subtractor for providing a control signal to the control logic.

19. A DC offset correction loop as in claim 18, further comprising:

a hold controller for controlling the input of the digital integrator and providing a predetermined amount of DC offset correction to the analog input signal.

20. A DC offset correction loop as in claim 19, wherein: the hold controller is comprised of at least one switch.

21. A DC offset correction loop as in claim 20 wherein the at least one switch is comprised of a plurality of logic devices.

22. A DC offset correction loop as in claim 18, further comprising;

at least one amplifier for amplifying the output of the at least one analog baseband filter.

23. A DC offset correction loop as in claim 18, wherein: the digital integrator includes at least one adder and at least one first delay circuit.

24. A DC offset correction loop as in claim 18, wherein: the ADC converts the analog signal to a multi-bit digital signal having desired resolution.

25. A DC offset correction loop as in claim 18, wherein: the at least one digital integrator produces a multi-bit signal.

26. A DC offset correction loop as in claim 18, wherein the control logic produces two digital signals from the at least one digital integrator.

27. A DC offset correction loop as in claim 18, wherein the DC offset correction is applied to the at least one analog baseband filter.

28. A DC offset correction loop as in claim 18, wherein the digital subtractor receives a delayed digital signal from the ADC.

29. A DC offset correction loop as in claim 28, wherein the control signal is a substantially fine adjustment for DC offset error correction.

30. A method for providing direct current (DC) offset comprising the steps of:

filtering an analog input signal having a DC offset with at least one baseband filter to remove unwanted signal components;

converting the filtered analog signal to a digital signal with an analog-to-digital converter (ADC);

integrating the digital signal from the ADC using a digital integrator for extracting undesired DC offset;

converting the extracted DC offset into an analog DC correction signal;

applying the analog DC correction signal to that at least one portion of the forward signal path filter for eliminating the DC offset at the final output of the forward signal path.

31. A method for providing DC offset as in claim 30, further comprising the step of:

holding the level of DC offset correction by controlling the digital integrator.

32. A method for providing DC offset as in claim 30, further comprising the step of: grounding an input to the digital integrator for holding a level of DC offset correction applied to the analog input signal.

33. A method for providing DC offset as in claim 30, further comprising the step of:

amplifying the output of the at least one baseband filter for input to the ADC.

* * * * *